(12) United States Patent
Searles et al.

(10) Patent No.: US 10,587,195 B2
(45) Date of Patent: Mar. 10, 2020

(54) INTEGRATED PASSIVE DEVICES TO REDUCE POWER SUPPLY VOLTAGE DROOP

(71) Applicant: Apple Inc., Cupertino, CA (US)

(72) Inventors: Shawn Searles, Austin, TX (US); Vidhya Ramachandran, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/489,798

(22) Filed: Apr. 18, 2017

(65) Prior Publication Data

US 2017/0317588 A1 Nov. 2, 2017

Related U.S. Application Data

(60) Provisional application No. 62/329,473, filed on Apr. 29, 2016.

(51) Int. Cl.
*H02M 3/158* (2006.01)
*H01L 25/065* (2006.01)
*H01L 25/16* (2006.01)
*H01L 25/00* (2006.01)

(52) U.S. Cl.
CPC ........ *H02M 3/158* (2013.01); *H01L 25/0657* (2013.01); *H01L 25/16* (2013.01); *H01L 25/50* (2013.01); *H01L 2224/16225* (2013.01); *H01L 2225/06513* (2013.01)

(58) Field of Classification Search
CPC . H02M 3/158; H02M 3/1582; H01L 25/0657; H01L 27/108; H01L 2225/06513
See application file for complete search history.

(56) References Cited

U.S. PATENT DOCUMENTS

| | | | |
|---|---|---|---|
| 7,781,882 B2 | 8/2010 | Zhong | |
| 7,952,160 B2 | 5/2011 | Triantafillon | |
| 8,779,849 B2 * | 7/2014 | Hollis | H05K 7/00 327/565 |
| 2004/0160753 A1 | 8/2004 | Vrtis | |
| 2006/0258048 A1 | 11/2006 | Vrtis | |
| 2014/0268615 A1 * | 9/2014 | Yun | H05K 7/1092 361/782 |
| 2015/0160701 A1 * | 6/2015 | Bruno | H01L 23/13 361/679.31 |
| 2016/0093588 A1 * | 3/2016 | Wang | B23H 7/10 257/737 |

* cited by examiner

*Primary Examiner* — Jung Kim
(74) *Attorney, Agent, or Firm* — Kowert, Hood, Munyon, Rankin & Goetzel, P.C.

(57) ABSTRACT

A system that includes multiple integrated circuits is disclosed. A first integrated circuit of the system includes a plurality of circuit blocks, and a first circuit block of the plurality of circuit blocks includes a first power terminal. A second integrated circuit of the system includes multiple voltage regulation circuits, a second power terminal coupled to an output of a given voltage regulation circuit, and a third power terminal coupled to an input of the given voltage regulation circuit. A substrate, included in the system, includes a plurality of conductive paths, each of which includes a plurality of wires fabricated on a plurality of conductive layers. The system further includes a power management unit that may be configured to generate a power supply voltage at a fourth power terminal that is coupled to the third power terminal via a first conductive path of the plurality of conductive paths.

14 Claims, 14 Drawing Sheets

US 10,587,195 B2

INTEGRATED PASSIVE DEVICES TO REDUCE POWER SUPPLY VOLTAGE DROOP

PRIORITY INFORMATION

The present application claims benefit of priority to U.S. Provisional Patent Application No. 62/329,473, entitled "INTEGRATED PASSIVE DEVICES TO REDUCE POWER SUPPLY VOLTAGE DROOP," filed Apr. 29, 2016.

BACKGROUND

Technical Field

Embodiments described herein relate to integrated circuits, and more particularly, to techniques for decoupling power supplies.

Description of the Related Art

A variety of electronic devices are now in daily use with consumers. Particularly, mobile devices have become ubiquitous. Mobile devices may include cell phones, personal digital assistants (PDAs), smart phones that combine phone functionality and other computing functionality such as various PDA functionality and/or general application support, tablets, laptops, net tops, smart watches, wearable electronics, etc.

Such mobile devices may include multiple integrated circuits, each performing different tasks. In some cases, circuits that perform different tasks may be integrated into a single integrated forming a system on a chip (SoC). The different functional units within a SoC may operate at different power supply voltage levels. In some designs, power supply or regulator circuits may be included in the SoC to generate different voltage levels for the myriad functional units included in the SoC.

Power supplies and regulation circuits may be used to generate different voltage levels for use by the various integrated circuits. During operation, changes in operation of the integrated circuits may result in variations in current demand from the power supplies and regulation circuits. In some cases, the power supplies and regulation circuits may not be able to respond to rapid changes in current demand, resulting in undesirable variation in the generated voltage levels.

SUMMARY OF THE EMBODIMENTS

Various embodiments of a system including multiple integrated circuit dies is disclosed. Broadly speaking, a first integrated circuit includes a plurality of circuit blocks, and a first circuit block of the plurality of circuit blocks includes a first power terminal. A second integrated circuit includes multiple voltage regulation circuits, a second power terminal coupled to an output of a given voltage regulation circuit, and a third power terminal coupled to an input of the given voltage regulation circuit. A substrate includes a plurality of conductive paths, each of which includes a plurality of wires fabricated on a plurality of conductive layers. A power management unit may be configured to generate a power supply voltage at a fourth power terminal that is coupled to the third power terminal via a first conductive path of the plurality of conductive paths.

In one embodiment, the system further includes a plurality of inductors and a plurality of capacitors. The power management unit further includes a plurality of Input/Output (I/O) terminals.

In a further embodiment, a given one of the plurality of inductors is coupled to a first I/O terminal of the plurality of I/O terminals via a second conductive path of the plurality of conductive paths. A given one of the plurality of capacitors is coupled to a second I/O terminal of the plurality of I/O terminals via a third conductive path of the plurality of conductive paths.

BRIEF DESCRIPTION OF THE DRAWINGS

The following detailed description makes reference to the accompanying drawings, which are now briefly described.

Figure 1:
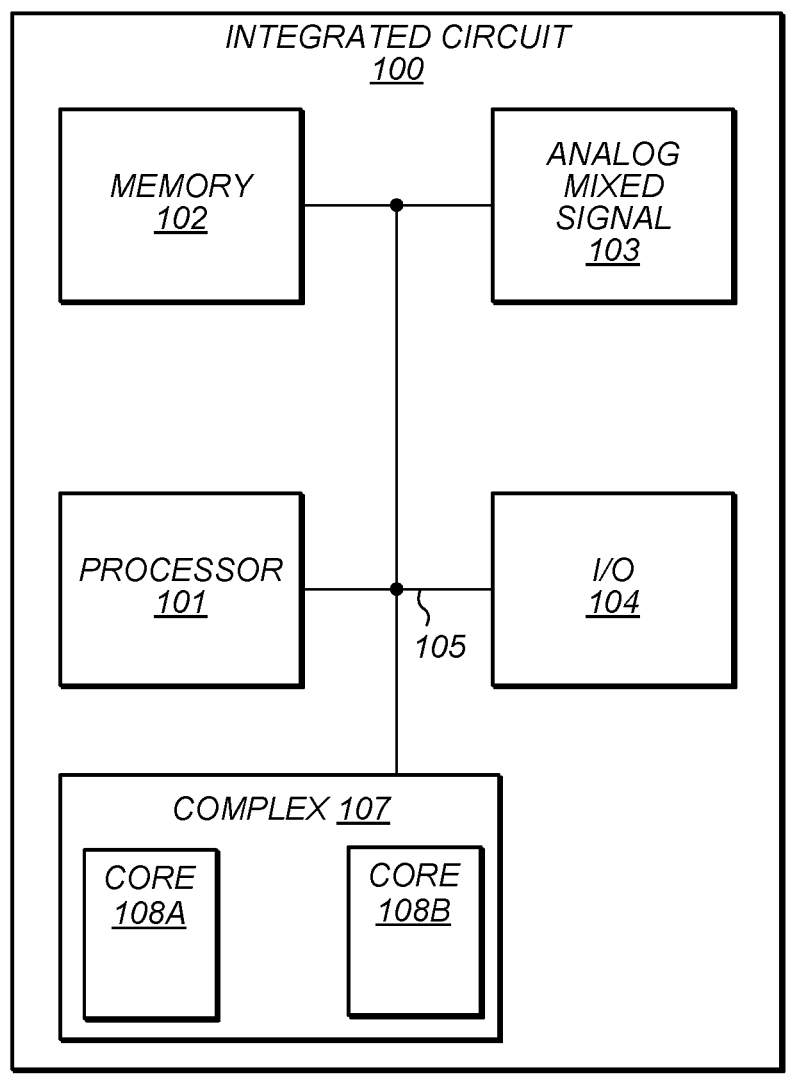
FIG. 1 illustrates an embodiment of an integrated circuit.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

In a computing system, multiple power supplies may be employed for different integrated circuits and different functional units or circuit blocks within a particular integrated circuit. Such power supplies may have different voltage levels and may be generated using voltage regulation circuits in order to minimize variation in the various voltage levels.

During operation of the computing system, variations in current demand by the different integrated circuits or the different functional units or circuit blocks within an integrated circuit may result in fluctuations in the voltage levels of the various power supplies from desired levels. To minimize this variation, or droop, capacitance may be coupled to the output of the power supplies and voltage regulation circuits.

Capacitance included as part of the Power Distribution Network (PDN) of the computing system may be used to aid the power supplies and voltage regulation circuits. In some cases, however, the capacitance in the PDN may be insufficient to achieve desired performance levels of the power supplies and voltage regulation circuits. In such cases, integrated passive devices (IPDs), which supply and absorb short duration variations in load current filtering high frequency noise from power supplies, may also be used to provide sufficient capacitance. The embodiments illustrated in the drawings and described below may provide techniques achieving desired voltage regulation circuit performance through the use of IPDs and various PDNs.

A block diagram of an integrated circuit including multiple functional units is illustrated in FIG. 1. In the illustrated embodiment, the integrated circuit 100 includes a processor 101, and a processor complex (or simply a "complex") 107 coupled to memory block 102, and analog/mixed-signal block 103, and I/O block 104 through internal bus 105. In various embodiments, integrated circuit 100 may be configured for use in a desktop computer, server, or in a mobile computing application such as, e.g., a tablet or laptop computer.

As described below in more detail, processor 101 may, in various embodiments, be representative of a general-purpose processor that performs computational operations. For example, processor 101 may be a central processing unit (CPU) such as a microprocessor, a microcontroller, an application-specific integrated circuit (ASIC), or a field-programmable gate array (FPGA).

Complex 107 includes processor cores 108A and 108B. Each of processor cores 108A and 108B may be representative of a general-purpose processor configured to execute software instructions in order to perform one or more computational operations. Processor cores 108A and 108B may be designed in accordance with one of various design styles. For example, processor cores 108A and 108B may be implemented as an ASIC, FPGA, or any other suitable processor design.

Memory block 102 may include any suitable type of memory such as a Dynamic Random Access Memory (DRAM), a Static Random Access Memory (SRAM), a Read-only Memory (ROM), Electrically Erasable Programmable Read-only Memory (EEPROM), or a non-volatile memory, for example. It is noted that in the embodiment of an integrated circuit illustrated in FIG. 1, a single memory block is depicted. In other embodiments, any suitable number of memory blocks may be employed.

Analog/mixed-signal block 103 may include a variety of circuits including, for example, a crystal oscillator, a phase-locked loop (PLL), an analog-to-digital converter (ADC), and a digital-to-analog converter (DAC) (all not shown). In other embodiments, analog/mixed-signal block 103 may be configured to perform power management tasks with the inclusion of on-chip power supplies and voltage regulators. Analog/mixed-signal block 103 may also include, in some embodiments, radio frequency (RF) circuits that may be configured for operation with wireless networks.

I/O block 104 may be configured to coordinate data transfer between integrated circuit 100 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, I/O block 104 may be configured to implement a version of Universal Serial Bus (USB) protocol or IEEE 1394 (Firewire®) protocol.

I/O block 104 may also be configured to coordinate data transfer between integrated circuit 100 and one or more devices (e.g., other computing systems or integrated circuits) coupled to integrated circuit 100 via a network. In one embodiment, I/O block 104 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, I/O block 104 may be configured to implement multiple discrete network interface ports.

In some embodiments, each of the aforementioned functional units may include multiple circuits, each of which may include multiple devices, such as, e.g., metal-oxide semiconductor field-effect transistors (MOSFETs) connected via multiple wires fabricated on multiple conductive layers. The conductive layers may be interspersed with insulating layers, such as, silicon dioxide, for example. Each circuit may also contain wiring, fabricated on the conductive layers, designated for a power supply net or a ground supply net.

Integrated circuit 100 may, in various embodiments, be fabricated on a silicon wafer (or simply "wafer") along with numerous identical copies of integrated circuit 100, each of which may be referred to as a "chip" or "die." During manufacture, various manufacturing steps may be performed on each chip in parallel. Once the manufacturing process has been completed, the individual chips may be removed from the wafer by cutting or slicing through unused areas between each chip.

Figure 2:
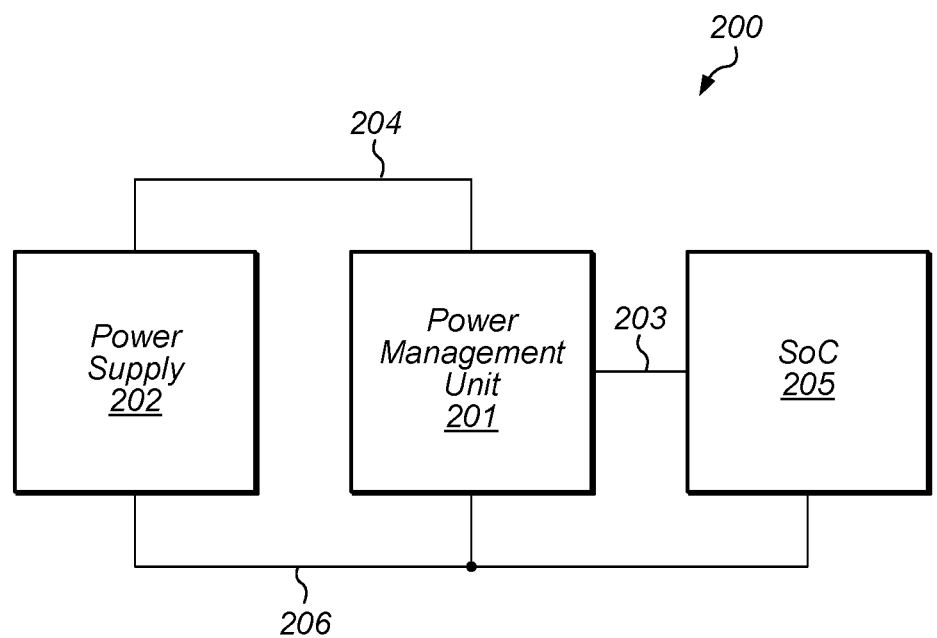
FIG. 2 illustrates an embodiment of a computing system

Turning now to FIG. 2, an embodiment of a computing system is illustrated. In the illustrated embodiment, computing system 200 includes power supply 202, power management unit (PMU) 201, and system-on-a-chip (SoC) 205.

In various embodiments, SoC 203 may correspond to integrated circuit 100 as illustrated in FIG. 1.

Power supply 202 is configured to generate a DC voltage level on supply voltage 204 relative to ground node 206. In various embodiments, power supply 202 may include circuitry (not shown) configured to convert an AC power signal to a desired DC voltage level. Alternatively, or additionally, power supply 202 may include a rechargeable battery and circuitry configured to monitor an amount of charge stored in the rechargeable battery and recharge the battery in response to determining the amount of charge stored in the battery has dropped below a predetermined level.

In various embodiments, PMU 201 may be configured to generate a predetermined voltage on regulated supply 203 relative to ground node 206 and dependent upon supply voltage 204. PMU 201 may include any suitable regulator circuit, such as, e.g., a buck regulator, employed to generate regulated supply voltage 203. In some cases, PMU 201 may include multiple passive devices (not shown), such as, e.g., inductors and capacitors, which may be employed in the generation of regulated supply 203.

During operation, PMU 201 may monitor power consumption, levels of activity, and the like, of SoC 205. Based on the monitored values, PMU 201 may adjust a voltage level of regulated supply 203. For example, during periods of less activity of SoC 205, PMU 201 may reduce the voltage level of regulated supply 203. It is noted that although only a single regulated supply is depicted in the embodiment illustrated in FIG. 2, in other embodiments, multiple regulated supplies, each with a respective voltage level, may be employed.

It is noted that the embodiment illustrated in FIG. 2 is merely an example. In other embodiments, different numbers of regulated power supply voltages may be employed.

Figure 3:
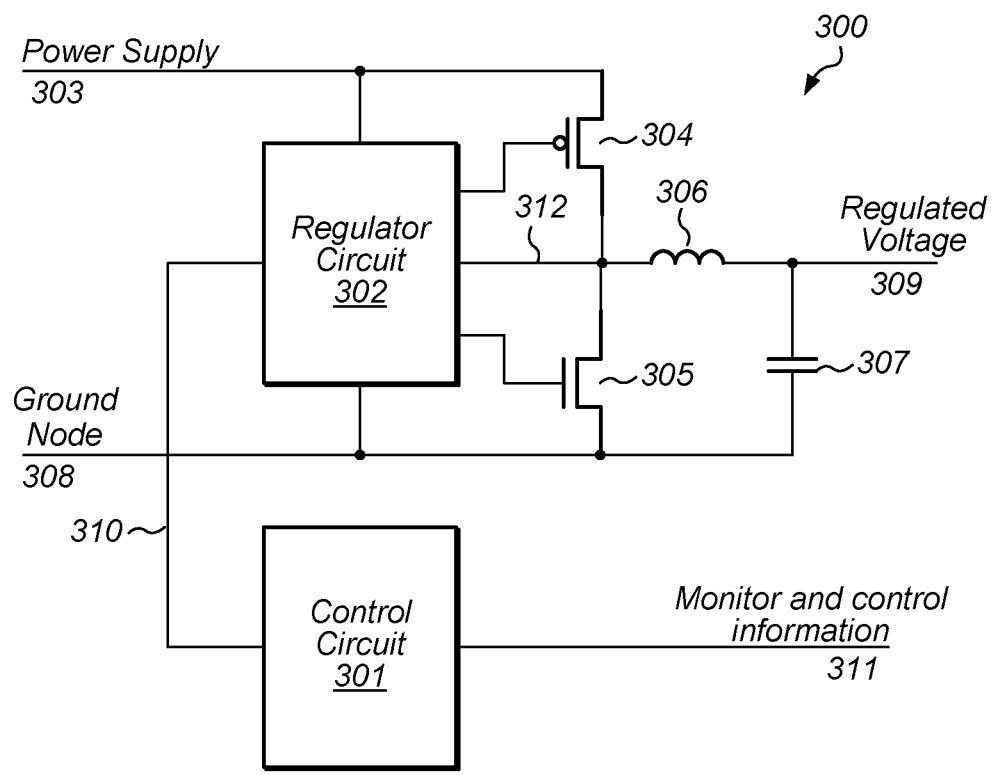
FIG. 3 illustrates a block diagram of power management unit.

An embodiment of a PMU is illustrated in FIG. 3. In various embodiments, PMU 300 may correspond to PMU 201 as depicted in the embodiment illustrated in FIG. 2. In the illustrated embodiment, PMU 300 includes regulator circuit 302 and control circuit 301.

Regulator circuit 302 is coupled between power supply 303 and ground node 308. It is noted that, in some embodiments, power supply 303 may correspond to power supply 204 of the embodiment of FIG. 2, and ground node 308 may correspond to ground node 206 as illustrated in FIG. 2. Regulator circuit 302 is further coupled to inductor 306, p-channel MOSFET 304, n-channel MOSFET 305, and control signal 310 generated by control circuit 301. Inductor 306 is further coupled to regulated output 309, and capacitor 307 which is, in turn, coupled to ground node 308. In some embodiments, regulated voltage 309 may correspond to regulated supply 203 as depicted in FIG. 2. Although a single regulator circuit is depicted in the embodiment illustrated in FIG. 3, in other embodiments, additional stages of regulation may be included in PMU 300. In some cases, an additional shunt regulator may be employed.

Although regulator circuit 302 is depicted as being coupled to a single p-channel MOSFET and a single n-channel MOSFET, in other embodiments, any suitable number of MOSFETs or types of MOSFETs may be employed. For example, p-channel MOSFET 304 and n-channel MOSFET 305 may be implemented using a cascode arrangement of two n-channel MOSFETs. Furthermore, in some embodiments, any suitable type of transconductance device may be used alternatively, or in addition to, p-channel MOSFET 304 and n-channel MOSFET 305.

During operation, control circuit 301 receives monitor and control information 311. In some embodiments, monitor and control information may be received from circuits included in an SoC, such as, e.g., SoC 205 as illustrated in FIG. 2. Alternatively, or additionally, information may be received from a user, or a circuit or system external to a system in which PMU 300 is included.

Based on monitor and control information 311, control circuit 301 generates control signal 310. Although a single control signal is depicted in the embodiment illustrated in FIG. 3, in other embodiments, any suitable number of control signals may be employed. Based on control signal 310 and a voltage level of node 312, regulator circuit 302 may selectively enable or disable each of p-channel MOSFET 304 and n-channel MOSFET 305 to apply charge to, or remove charge from node 312. For example, if the voltage level on node 312 drops below a predetermined level, regulator circuit 302 may enable p-channel MOSFET 304 to allow charge to flow from power supply 303 onto node 312, thereby increasing the voltage level on node 312.

Capacitor 307 may, in various embodiments, provide local energy storage, allowing PMU 300 to respond more quickly to changes in power demand on regulated voltage 309. For example, if there is a sudden increase in current demand on regulated voltage 309, some of the needed current may be supplied by charge stored in capacitor 307, thereby providing additional time to regulator circuit 302 to detect any change in the voltage level of node 312 resulting from the increased current demand, and enable p-channel MOSFET 304 accordingly. Although only a single capacitor is shown, in other embodiments, any suitable number of capacitors may be employed.

Although depicted as a single unit in the embodiment illustrated in FIG. 3, PMU 300 may, in various embodiments, consist of multiple physical blocks included within a computing system. In some embodiments, inductors and other passive devices for various regulator stages may be includes as discrete components within the computing system. Additionally, or alternatively, high frequency circuits included in regulator 302 may be fabricated as a separate integrated circuit to be included in the computing system. As will be described below, in more detail, a PMU may be partitioned in various ways in different embodiments of a computing system.

It is noted that the embodiment illustrated in FIG. 3 is merely an example. In other embodiments, different circuits, and different arrangements of circuits are possible and contemplated.

Figure 4A:
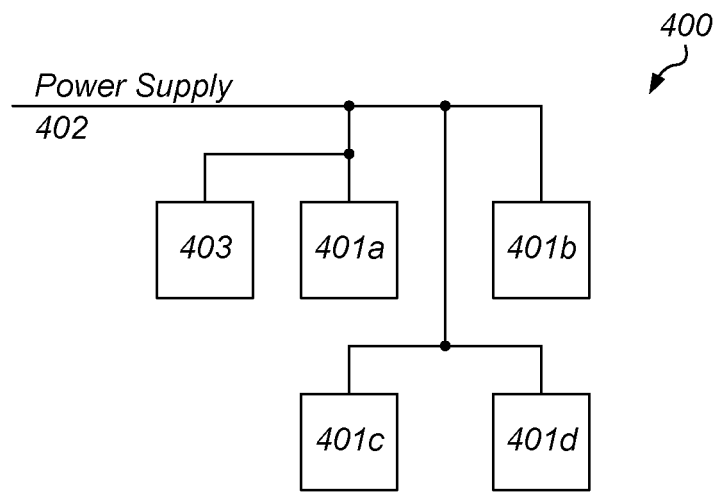
FIG. 4A illustrates a block diagram of a system with an integrated passive device.

In some computing systems, capacitors, or other reactive circuit elements, may be used to filter power supplies for certain circuit blocks within an integrated circuits. Some circuit blocks generate high frequency noise on the power supplies during operation. The capacitors may provide a low impedance path to ground for such high frequency noise, as well as provide local energy storage for periods of high current demand from a particular circuit block. Such capacitors (commonly referred to as "integrated passive devices" or "IPDs") may be fabricated as part of the system integrated circuit, or as a separate integrated circuit, which is coupled to the system integrated circuit. An example of a system with such a capacitor is illustrated in FIG. 4A.

In the illustrated embodiment, system 400 includes circuit blocks 401a-d, each of which is coupled to power supply 402. In various embodiments, circuit blocks 401a-d may correspond to cores 108a-b, as illustrated in FIG. 1. During operation, the charging and discharging of circuit nodes within circuits blocks 401a-d may generate high frequency noise on power supply 402, which may affect the operation of circuit blocks 401a-d, or other circuit blocks (not shown) coupled to power supply 402.

IPD 403 is coupled power supply 402 and may filter any induced noise on power supply 402. In various embodiments, IPD 403 may include one or more capacitors or other reactive circuit elements. Additionally, or alternatively, capacitance included within IPD 403 may contribute to the overall capacitance of the PDN and may affect droop on power supply 402.

Figure 4B:
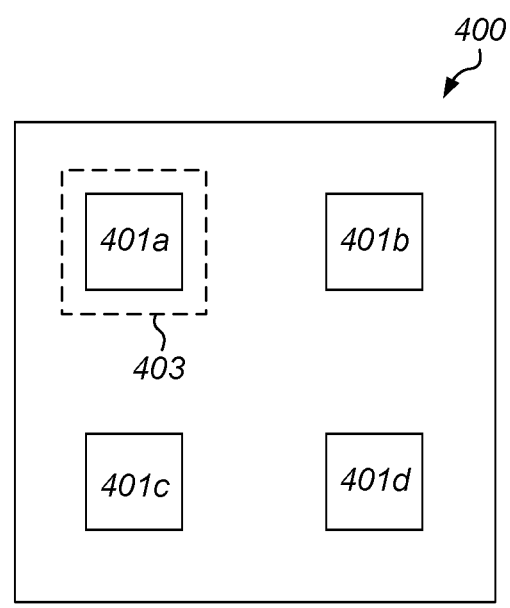
FIG. 4B illustrates a bottom view of a system with an integrated passive device.

To minimize resistance between IPD 403 and a particular circuit block, IPD 403 may be placed in close proximity to the particular circuit block. As shown in FIG. 4B, IPD 403 is placed above circuit block 401a in system 400. In some embodiments, power supply connections to circuit block 401a may pass through IPD 403, to allow IPD 403 direct access to the power supply wiring. In some embodiments, IPD 403 may be fabricated into an integrated circuit including system 400, while, in other embodiments, IPD 403 may be fabricated as a separate integrated circuit, and mounted into a computing system as described below, in more detail.

It is noted that the system depicted in FIG. 4A and FIG. 4B is merely an example. In other embodiments, different numbers of circuit blocks and IPDs may be employed.

Figure 5A:
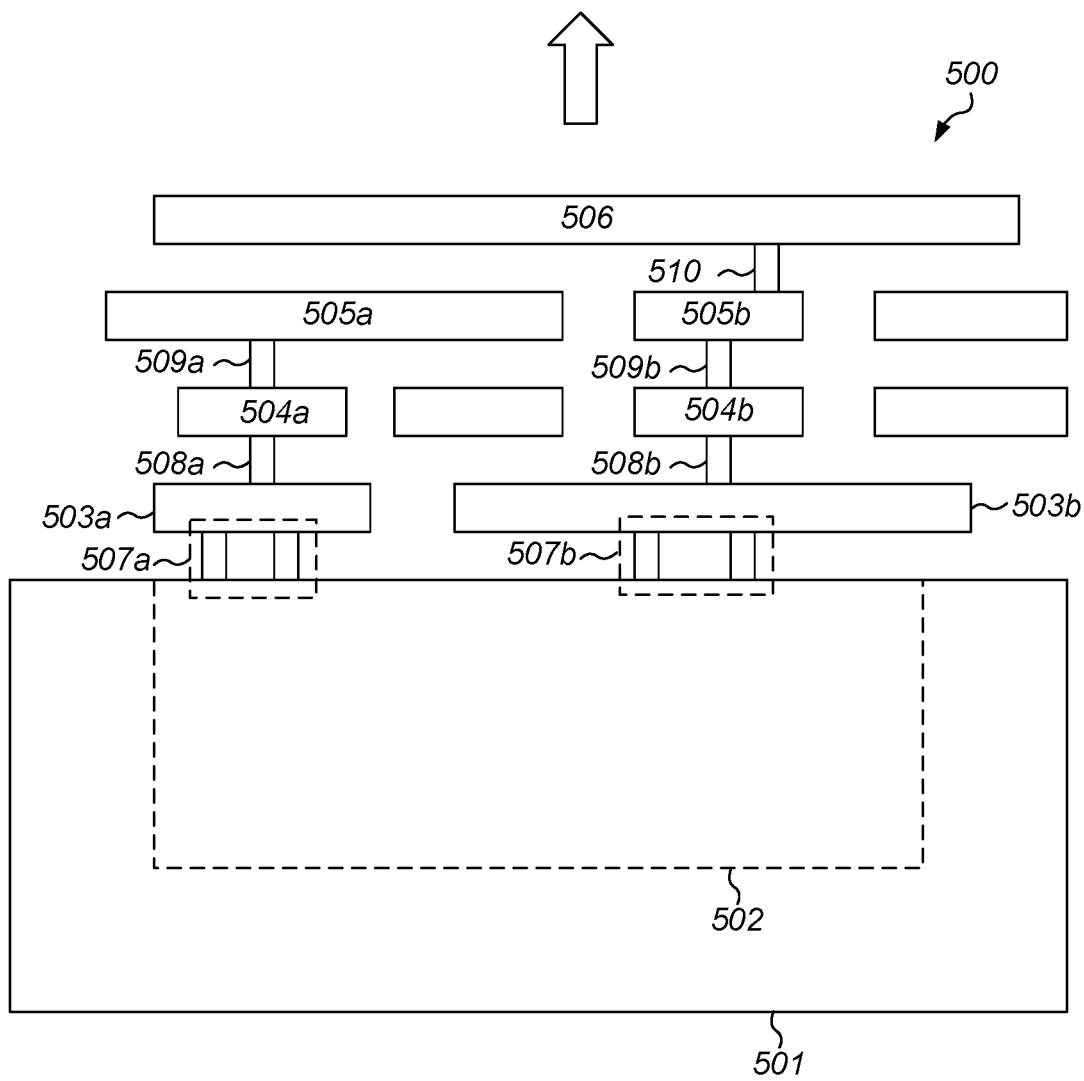
FIG. 5A illustrates a cross section of an integrated passive with interconnect.

Turning to FIG. 5A, a cross section of an IPD that includes capacitor with interconnect is illustrated. In various embodiments, cross section 500 may correspond a cross section of IPD 400 as illustrated in FIG. 4. In the illustrated embodiment, capacitor structure 502 is included in substrate 501. Capacitor structure 502 may, in various embodiments, include conductor layers separated by insulating layers. In some cases, the conductor layers may be deposited in trenches etched into substrate 501. Although depicted as being embedded in substrate 501, in other embodiments, capacitor structure 502 may be deposited on a surface of substrate 501.

Terminals of capacitor structure 502 are coupled to wires 503a and 503b by vias 507a and 507b, respectively. It is noted that for the purposes of clarity, insulating material, such as, e.g., silicon dioxide, between wires 503a and 503b and substrate 501 have been omitted from FIG. 5A. During manufacture, a layer of metal, such as, e.g., aluminum or copper, may be deposited. The deposited layer of metal may then be patterned and etched to form wires 503a and 503b. In various embodiments, holes may be etched in the insulating material, and filled with a conductive material, such as, e.g., tungsten, to create vias 507a and 507b.

In a similar fashion, wires 504a and 504b may be created on another conductor layer isolated from the aforementioned layer that includes wires 503a and 503b by another insulating layer. Vias 508a and 508b couple wires 504a to 503a, and 504b to 503b, respectively. Additional wires 505a, 505b, and 506 are created in a similar fashion, with vias 509a, 509b, and 510, providing coupling between the wires on the various conductor layers.

The shape and orientation of the wires, such as, e.g., 505a, may be selected to allow terminals of a particular circuit block to be coupled to terminals of the IPD. In some embodiments, wires on a top conductor layer may be coupled to solder bumps or other suitable material that allows the IPD to be coupled to other components, such as, integrated circuit 100, for example.

It is noted that the embodiment illustrated in FIG. 5A is merely an example. In other embodiments, different numbers of conductor layers, and different arrangements of wires on the conductor layers may be employed.

Figure 5B:
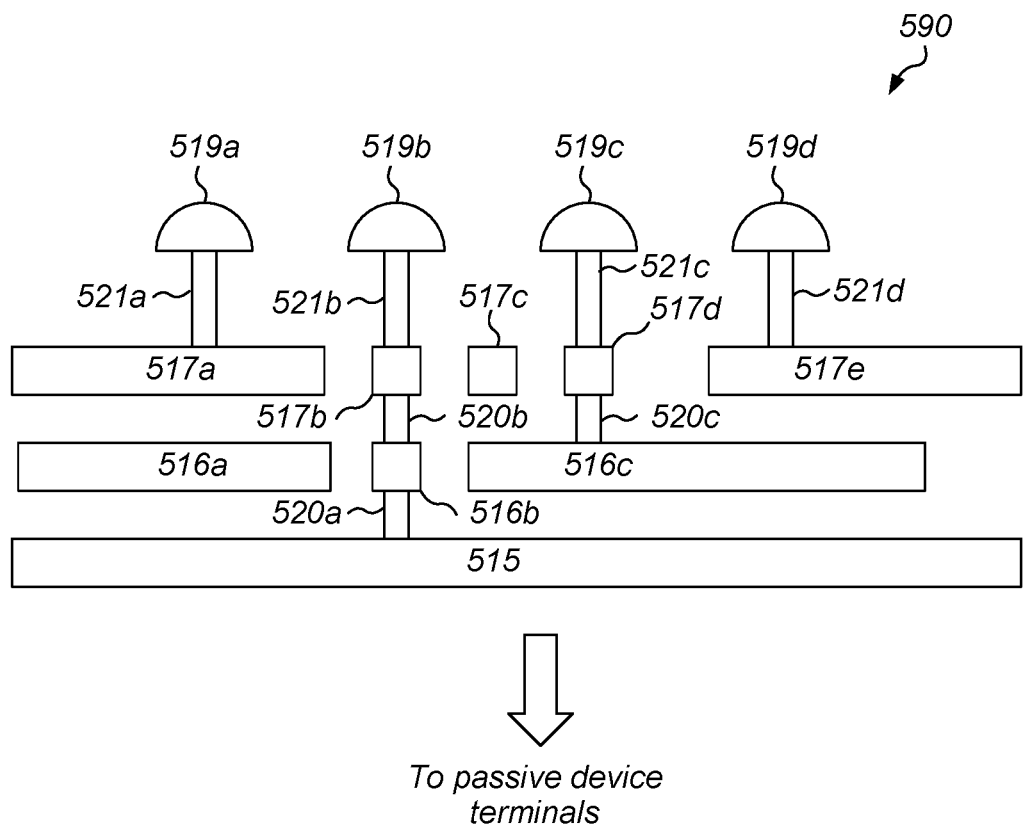
FIG. 5B illustrates an embodiment of top interconnect of an integrated passive device.

Turning to FIG. 5B, the top interconnect of an IPD is illustrated. In some embodiments, interconnect 590 may be coupled to IPD 500 as illustrated in FIG. 5A. Interconnect 590 includes wires 515, 516a-c, and 517a-e, vias 520a-b, and 521a-d, and micro-bumps 519a-d.

Each of wires 515, 516a-c, and 517a-d may be fabricated on separate conductive layers, each conductive layer separated by an insulating layer. For the purposes of the clarity, the insulating layers have been omitted from FIG. 5B. A wire fabricated on a particular conductive layer may be coupled to a wire fabricated on a different conductive layer using a via, such as, e.g., via 520a. In various embodiments, vias, such as those depicted in FIG. 5B, may be fabricated using tungsten or any other suitable material.

In the present embodiments, wires 517a, 517b, 517d, and 517e are coupled to micro-bumps 519a-d, respectively, using vias 521a-d. Micro-bumps 519a-d may be of suitable size for mounting on an SoC or other suitable substrate, and may be arranged to correspond to connection locations on the SoC. Such micro-bumps may be fabricated using any suitable conductive material.

It is noted that the top interconnect depicted in FIG. 5B is merely an example. In other embodiments, different wiring layers, and different configurations of wires are possible and contemplated.

Figure 12A:
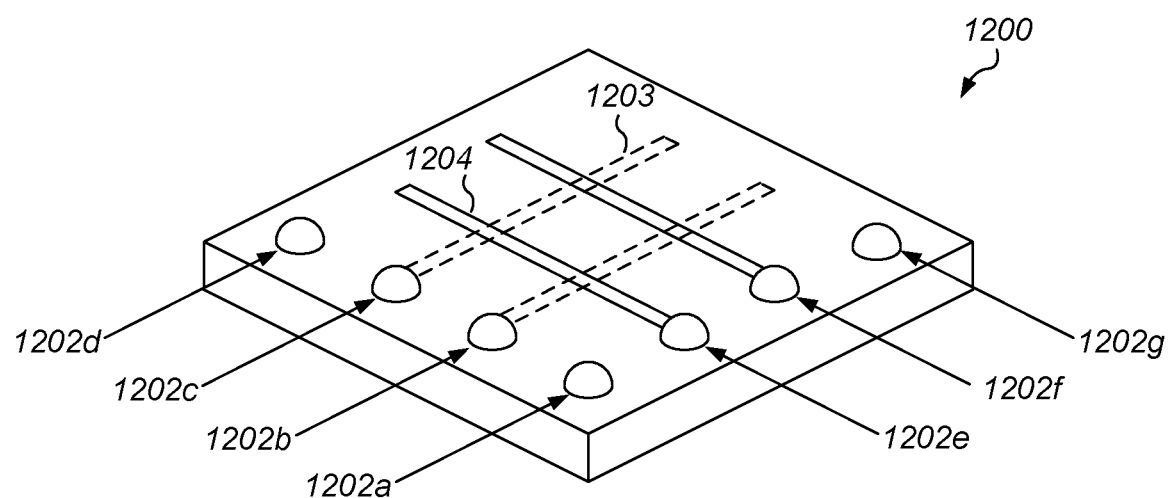
FIG. 12A illustrates a block diagram of an integrated passive device using bumped bonding sites.

Turning to FIG. 12A, another view of an IPD is illustrated. In various embodiments, IPD 1200 may correspond to the IPD depicted in FIG. 5A and FIG. 5B. In the illustrated embodiment, IPD 1200 includes micro-bumps 1202a-g, and wires 1203 and 1204.

Micro-bumps 1202a-g may, in various embodiments, correspond to micro-bumps 519a-d as illustrated in FIG. 5B. In some embodiments, micro-bumps 1202a-g may be arranged to match bonding locations on an SoC or other suitable integrated circuit. Micro-bump 1202c is coupled to wire 1203, and micro-bump 1202e is coupled to 1204. It is noted that other of micro-bumps 1202a-g may be coupled to other wires, which have been omitted for clarity.

In some embodiments, micro-bump 1202c may be coupled to a positive power supply node on an SoC, while micro-bump 1202e may be coupled to a ground supply on the SoC. Wires 1203 and 1204 may be fabricated on different conductive layers, and may be coupled to additional wires (not shown), which are, in turn, coupled to a capacitor or other passive device (also not shown). Although wires 1203 and 1204 are depicted as being oriented perpendicular to each other, in other embodiments, any suitable orientation of wires on different conductive layers may be employed.

It is noted that the embodiment illustrated in FIG. 12A is merely an example. In other embodiments, different numbers of micro-bumps, and different arrangements of micro-bumps and wires may be employed.

Figure 12B:
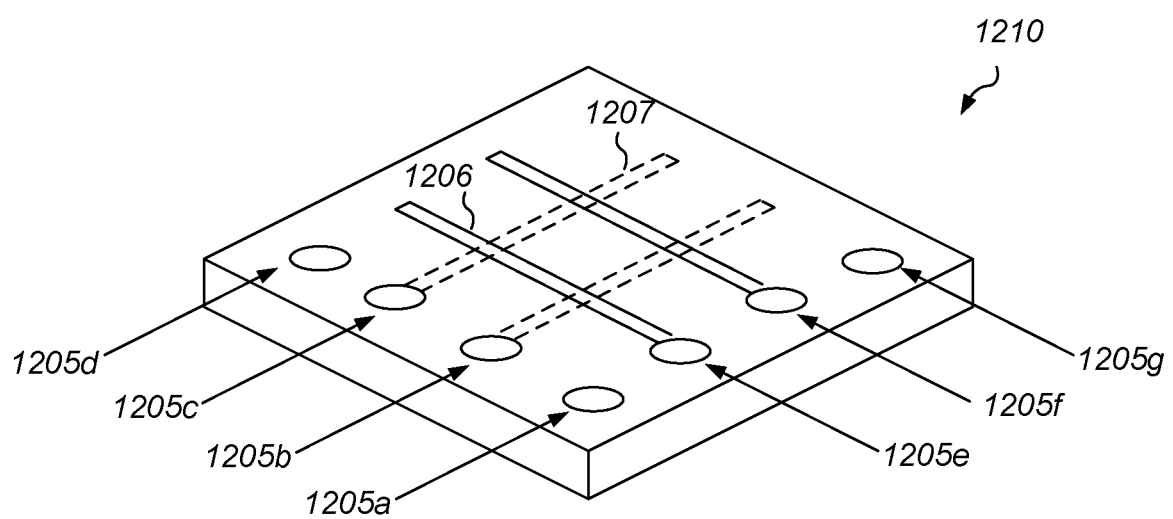
FIG. 12B illustrated a block diagram of an integrated passive device using planar bonding sites.

In some cases, planar bonding sites may be employed on an IPD. An embodiment of an IPD using planar pads is illustrated in FIG. 12B. In various embodiments, IPD 1210 may correspond to the IPD depicted in FIG. 5A and FIG. 5B. In the illustrated embodiment, IPD 1210 includes planar pads 1205a-g, and wires 1206 and 1207.

Planar pads 1205a-g may, in various embodiments, be arranged to match planar bonding locations on an SoC or other suitable integrated circuit. In some cases, planar pads 1205a-g may be bonding to corresponding sites on an SoC using a two-part bonding process (also referred to as a "hybrid bonding process"). For example, the bonding process may include coupling oxide regions of the SoC and the IPD using van der Waals forces. Once coupled, the coupled SoC IPD system may be heated allowing metal in the planar pads of the SoC and IPD to co-mingle and form an electrical connection. It is noted that the planar pads of the SoC and the IPD may employ different types of metal, such as, copper, aluminum, or any other suitable type of metal.

Planar pad 1202c is coupled to wire 1206, and planar pad 1205e is coupled to 1207. It is noted that other of planar pads 1205a-g may be coupled to other wires, which have been omitted for clarity.

Figure 13:
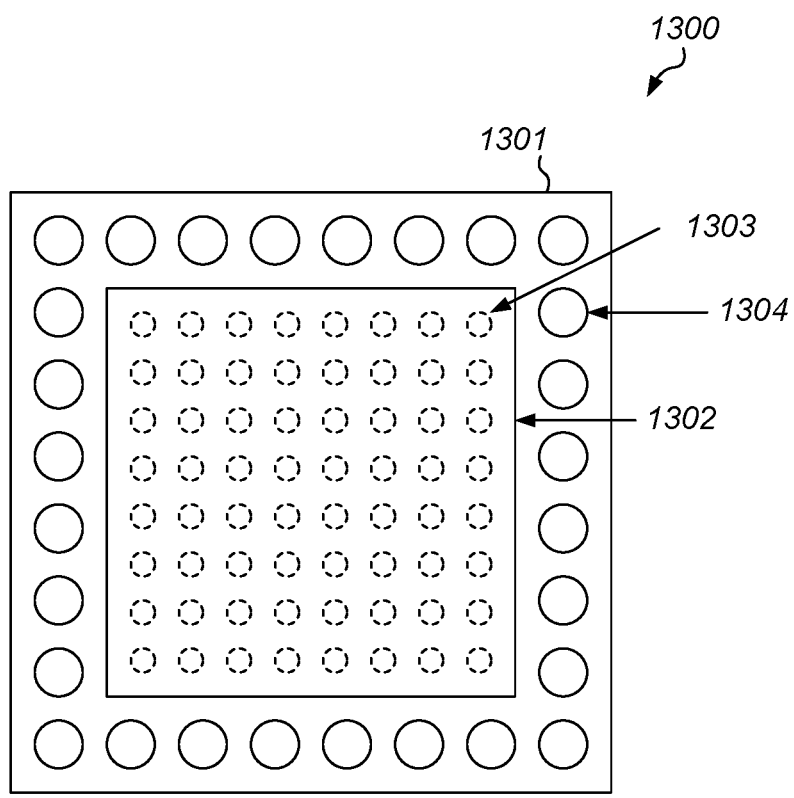
FIG. 13 illustrates a block diagram of an integrated passive device.

As described above, an IPD may be coupled to an SoC or other suitable integrated circuit to provide additional capacitance, inductance, and the like, to the circuits included in the SoC. In some cases, solder bumps may be omitted on the SoC to provide space to mount the IPD. Such an arrangement is illustrated in FIG. 13.

In present embodiment, system 1300 includes SoC 1301 and IPD 1302. SoC 1301 includes multiple solder bumps, such as, solder bump 1304, for example. These solder bumps may be coupled to internal wiring included in SoC 1301 which, in turn, may be coupled to various circuits included in SoC 1301. The solder bumps of SoC 1301 may be coupled to power supply terminals, or input/output terminals of the circuits included in SoC 1301.

The solder bumps of SoC 1301 may be arranged to leave an area for mounting IPD 1302. Although, in the present embodiment, IPD 1302 is shown in the center of SoC 1301, in other embodiments, IPD 1302 may be placed in any suitable location. For example, in some embodiments, IPD 1302 may be oriented to minimize a distance between passive components, such as, e.g., capacitors, included in IPD 1302 and specific circuits included in SoC 1301.

IPD 1302 may be coupled to terminals on SoC 1301 by a set of micro-bump, such as, e.g., micro-bump 1303. In various embodiments, each of the micro-bumps of IPD 1302 may be coupled to a power or ground terminal of SoC 1301. Although the micro-bumps of IPD 1302 are depicted in FIG. 13 as being arranged in grid, in other embodiments, any suitable arrangement of micro-bumps is possible.

By employing passive devices external to an SoC, the performance of some circuits included in the SoC may be improved. For example, by using multiple external capacitors, voltage droop on regulated power supplies included in the SoC may be managed. As described above, IPDs that include capacitors may be mounted onto SoCs or other suitable integrated circuits as part of a computing system. An example of such a computing system can be seen in the embodiment illustrated in FIG. 6. In the illustrated embodiment, computing system 600 includes SoC 607 coupled DRAM package on package (PoP) substrate 608 via solder bumps 612a and 612b. In various embodiments, SoC 607 may correspond to integrated circuit 100 as illustrated in FIG. 1. DRAMs 608a and 608b may be mounted on DRAM PoP substrate 608. Terminals on DRAMs 608a and 608b may be coupled to terminals on DRAM PoP substrate 608 using bond wires (not shown). Although only two DRAMs are shown in the present embodiment, in other embodiments, any suitable number of DRAMs may be employed.

IPD 606 is coupled to SoC 607. In various embodiments, IPD 606 may correspond to IPD 403 as illustrated in FIG. 4. SoC 607 is further coupled to substrate 601 via solder bumps 613a and 613b. Substrate 601 may, in various embodiments, include wires fabricated on multiple conductive layers, which are separated by insulating layers. The wires may be arranged to provide conductive paths through substrate 601 from solder bumps 613a and 613b to solder bumps 614a, 614b, and 615. Although a single IPD is depicted as being coupled to SoC 607, in other embodiments, any suitable number of IPDs may be employed. Moreover, although IPD 606 is depicted as being coupled to SoC 607 via solder bumps, in other embodiments, planar pads, such as those depicted in FIG. 12B, may be employed to couple IPD 606 to SoC 607.

One or more power supply voltages may be generated by CLVR 603, which may include one or more inductors along voltage regulator circuits and other suitable circuitry. In various embodiments, CLVR 603 may be fabricated on a semiconductor manufacturing process that allows for the fabrication of inductors and other passive circuit elements. CLVR 603 is coupled to substrate 601 via solder bumps 614a and 614b. CLVR 603 is further coupled to IPD 604, which may, in various embodiments, be of lo similar construction to IPD 606. CLVR 603 is further coupled to high frequency voltage regulator (HFVR) circuits, denoted as HFVR 602. In various embodiments, HFVR 602 may include any suitable portion of regulators circuit 302, and may be fabricated using an appropriate semiconductor manufacturing process. Although a single IPD is depicted as being coupled to CLVR 603, in other embodiments, any suitable number of IPDs may be employed.

Figure 6:
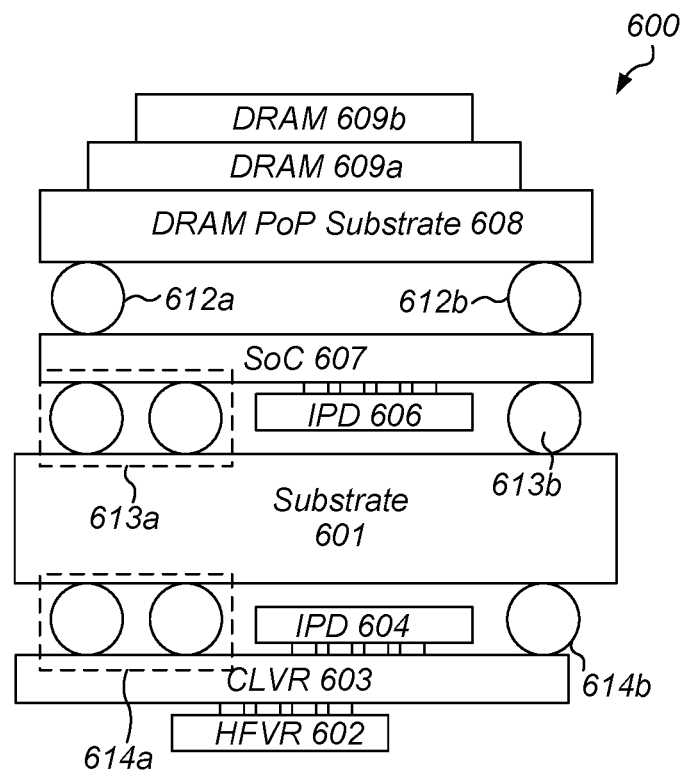
FIG. 6 illustrates an embodiment of a system including multiple integrated passive devices.

It is noted that the embodiment illustrated in FIG. 6 is merely an example. In other embodiments, different components, and different arrangements of components are possible and contemplated.

Figure 7:
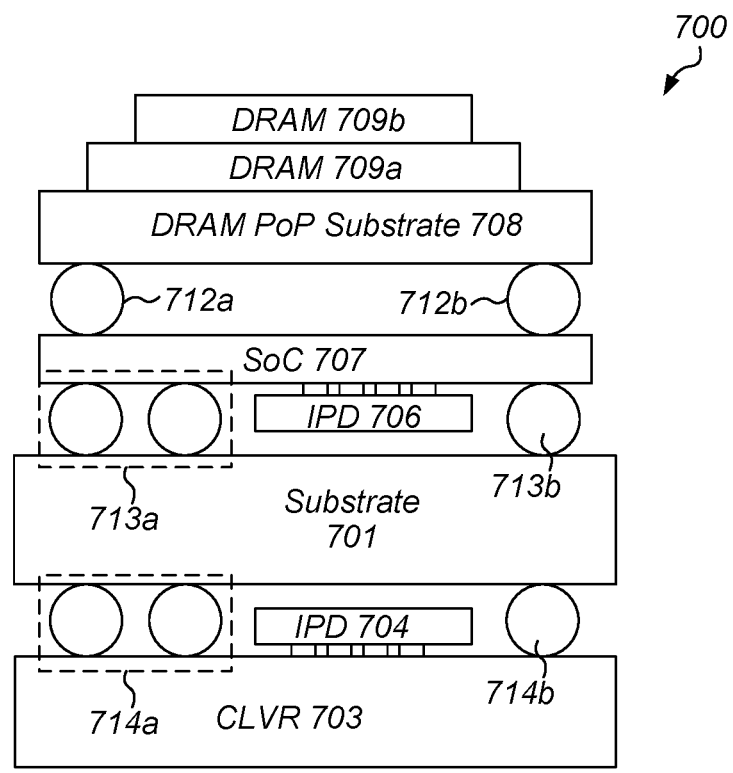
FIG. 7 illustrates another embodiment of a system including multiple integrated passive devices.

Turning to FIG. 7, another embodiment of a computing system is illustrated. In the illustrated embodiment, computing system 700 includes substrate 701, SoC 707, DRAM PoP substrate 708, DRAMs 709a-b, and IPD 704 and 706. In a similar fashion to the embodiment depicted in FIG. 6, SoC 707 is coupled to IPD 706 and DRAM PoP substrate 708. SoC 707 is further coupled to substrate 701, which may, in various embodiments, be similar to substrate 601 as depicted in the embodiment illustrated in FIG. 6.

In a similar fashion to substrate 601 as depicted in FIG. 6, substrate 701 includes multiple conductive paths coupled to terminals of SoC 707 via solder bumps 713a-b. SoC 707 is further coupled to IPD 706. Some conductive paths of substrate 701 may be coupled to CLVR 703 via solder bumps 714a-b. In the present embodiment, CLVR 703 is coupled to IPD 704.

In various embodiments, CLVR 703 may include voltage regulator circuits such as those described above in reference to FIG. 3. CLVR 703 may be configured to further regulate one of the power supply voltage levels provided by a power supply circuit, battery, or other suitable source. In some embodiments, CLVR 703 may generate regulated supplies for one or more functional unit or circuit blocks included in SoC 707. In various embodiments, an amount of capacitance included in IPD 706 may be selected dependent upon a desired amount of droop in a corresponding power supply voltage level.

DRAM PoP substrate 708 is also coupled to SoC 707 via solder bumps 712a-b, and DRAMs 709a-b are mounted and coupled to DRAM PoP substrate 708 in any suitable manner. In various embodiments, SoC 707 may include through silicon vias or other suitable technology that may be employed to couple power terminals of DRAM PoP substrate 708 to power supply voltages via conductive paths included in substrate 701.

IPDs 704 and 706 may, in various embodiments, include one or more capacitors and multiple wiring layers as described about in regard to FIG. 5A and FIG. 5B. In some embodiments, values of capacitors included in IPDs 704 and 706 may be selected based on a desired amount of voltage droop occurring on regulated power supplies generated by CLVR 703, or other performance characteristics of CLVR 703.

It is noted that the embodiment illustrated in FIG. 7 is another example. In other embodiments, different arrangements of the components may be employed.

Figure 8:
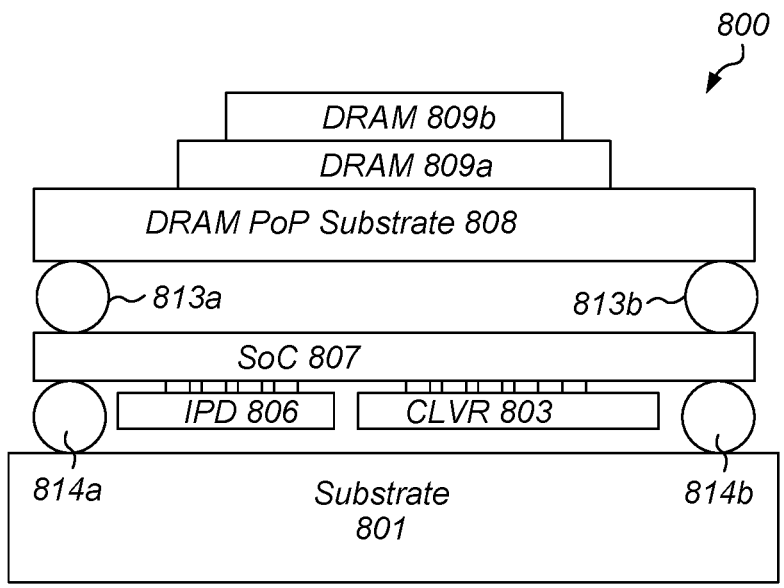
FIG. 8 illustrates another embodiment of a system including multiple integrated passive devices.

Another embodiment of a computing system is illustrated in FIG. 8. In the illustrated embodiment, computing system 800 includes substrate 801, SoC 807, IPD 806, CLVR 803, DRAM PoP substrate 808, and DRAMs 809a-b.

In a similar fashion to substrate 601 as depicted in FIG. 6, substrate 801 includes multiple conductive paths coupled to terminals of SoC 807 via solder bumps 814a-b. SoC 807 is further coupled to IPD 806 and CLVR 804. DRAM PoP substrate 808 is also coupled to SoC 807 via solder bumps 813a-b, and DRAMs 809a-b are mounted and coupled to DRAM PoP substrate 808 in any suitable manner.

In various embodiments, CLVR 803 may include voltage regulator circuits including, but not limited to, inductors, high frequency circuits, and the like. CLVR 803 may be configured to further regulate power supply voltage levels generated by a power supply circuit, a batter, or other suitable source. In some embodiments, CLVR 803 may generate regulated supplies for one or more functional unit or circuit blocks included in SoC 807. In various embodiments, an amount of capacitance included in IPD 806 may be selected dependent upon a desired amount of droop in a corresponding power supply voltage level.

It is noted that the embodiment illustrated in FIG. 8 is merely an example. Different components and different arrangements of components may be employed in other embodiments.

Figure 9:
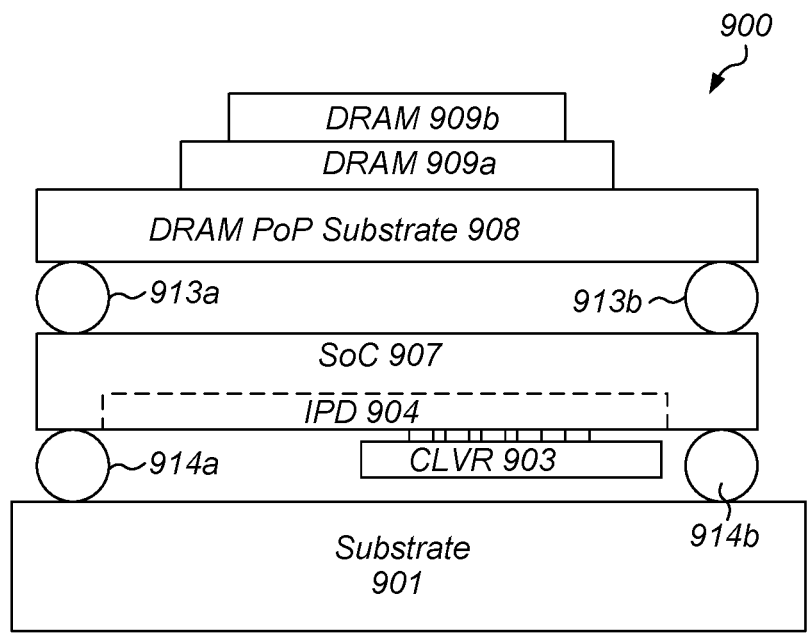
FIG. 9 illustrates another embodiment of a system including multiple integrated passive devices.

Turning to FIG. 9, another embodiment of a computing system is illustrated. In the illustrated embodiment, computing system 900 includes substrate 901, SoC 907, CLVR 903, DRAM PoP substrate 908, and DRAMs 909a-b.

In a similar fashion to substrate 601 as depicted in FIG. 6, substrate 901 includes multiple conductive paths coupled to terminals of SoC 907 via solder bumps 914a-b. SoC 907 is further coupled to CLVR 903. DRAM PoP substrate 908 is also coupled to SoC 907 via solder bumps 913a-b, and DRAMs 909a-b are mounted and coupled to DRAM PoP substrate 908 in any suitable manner.

In various embodiments, CLVR 903 may include voltage regulator circuits including, but not limited to, inductors, high frequency circuits, and the like. CLVR 903 may be configured to further regulate a power supply voltage level provided by a battery or other power supply. In some embodiments, CLVR 903 may generate regulated supplies for one or more functional unit or circuit blocks included in SoC 907.

In the present embodiment, IPD 904, is fabricated on the same integrated circuit as SoC 907, and may include any suitable number of capacitors and wiring layers to connect to desired power supply nodes within SoC 907. In some embodiments, an amount of capacitance included in IPD 904 may be selected dependent upon a desired amount of droop in the voltage levels of the desired power supply nodes within SoC 907.

It is noted that the embodiment illustrated in FIG. 9 is merely an example. In other embodiments, the various components may be arranged in different configurations.

Figure 10:
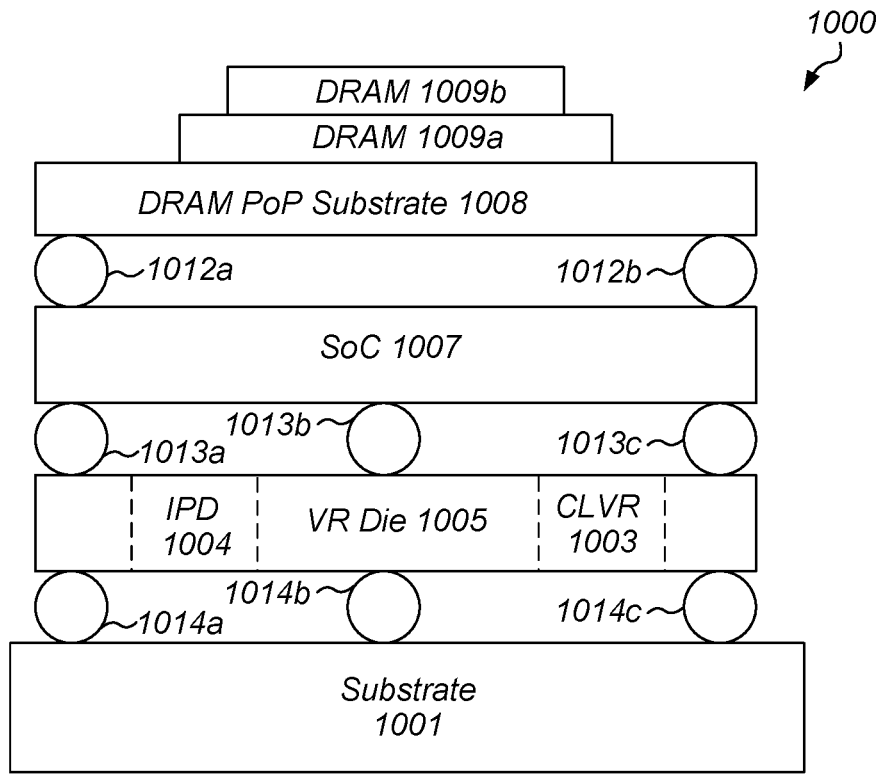
FIG. 10 illustrates another embodiment of a system including multiple integrated passive devices.

Turning to FIG. 10, another embodiment of a computing system is illustrated. In the illustrated embodiment, computing system 1000 includes substrate 1001, SoC 1007, Voltage Regulator (VR) die 1005, DRAM PoP substrate 1008, and DRAMs 1009a-b.

In a similar fashion to substrate 601 as depicted in FIG. 6, substrate 1001 includes multiple conductive paths coupled to terminals of VR die 1105 via solder bumps 1014a-c. VR die 1005 is further coupled to SoC 1007. DRAM PoP substrate 1008 is also coupled to SoC 1007 via solder bumps 912a-b, and DRAMs 1009a-b are mounted and coupled to DRAM PoP substrate 1008 in any suitable manner.

VR die 1005 includes one or more capacitors, denoted as IPD 1004, and CLVR 1003. As described above, in regard to other embodiments of CLVRs, CLVR 1003 may include voltage regulator circuitry, inductors, control circuitry, and other suitable components. VR die 1005 may receive power supply voltages from any suitable source, such as, e.g., a battery, a power management unit, and the like, and be configured to regulate the received power supply voltages to generate power supply voltage levels for circuits included in SoC 1007. VR die 1005 may be fabricated using a semiconductor process that allows for the fabrication of passive components such as, inductors and capacitors, for example. In some embodiments, SoC 1007 may include through silicon vias that allow power supply voltages generated by circuitry included in VR die 1005 to be passed onto DRAMs 1009a-b.

It is noted that the embodiment illustrated in FIG. 10 is merely an example. In other embodiments, different components and different arrangements of components are possible and contemplated.

Figure 11:
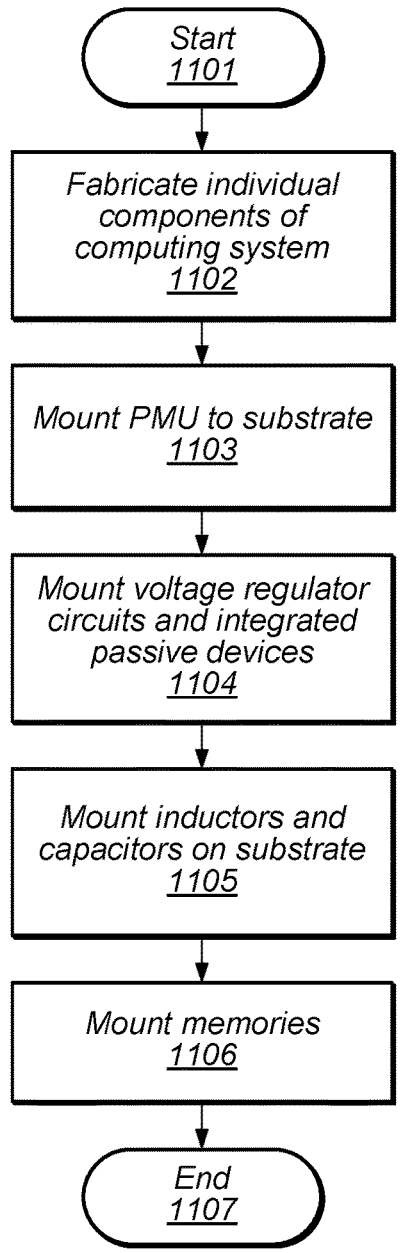
FIG. 11 illustrates a flow diagram depicting a method of assembling a computing system.

Turning to FIG. 11, a flow diagram depicting an embodiment of a method assembling a computing system is illustrated. The method begins in block 1101. Individual components included in the computing system may then be fabricated (block 1102). In various embodiments, such components may include an SoC integrated circuit, such as, e.g., integrated circuit 100, along with DRAMs or other memory devices. Additionally, voltage regulator circuits and PMUs may be fabricated in various configurations. In some embodiments, substrates that include multiple conductive paths may also be fabricated.

Each component may be fabricated on a particular semiconductor manufacturing process. Different processes may be used for different components so that specialized circuits elements, such as, e.g., may included in a particular one of the components in the computing system.

With the components fabricated, a PMU may then be mounted to a substrate (block 1103). In various embodiments, solder balls, or other suitable materials, may be employed to couple terminals of the PMU to corresponding terminals of the substrate. Voltage regulator circuits may then be mounted (block 1104). In some embodiments, the regulator circuits may be mounted to substrate in a similar fashion to the PMU. The regulator circuits may be fabricated on a single integrated circuit, or may be fabricated on multiple integrated circuits, each of which may be mounted to the substrate. In some cases, some of the regulator circuits may be mounted to an SoC included in the computing system, or may be included in the integrated circuit, which includes the SoC.

Discrete inductors and capacitors may then be mounted to substrate at any suitable location on the substrate (block 1105). Terminals on the inductors and capacitors may be coupled to terminals on the substrate, which, in turn, are coupled to conductive paths within the substrate that are coupled to terminals of the PMU. It is noted that any suitable number of inductors and capacitors, of any suitable value, may be employed.

Memories may then be mounted to the computing system (block 1106). In various embodiments, the memories, such as, e.g., DRAMs, may be mounted on a PoP substrate. Terminals on the memories may be bonded using wires, or other suitable materials, to terminals on the PoP substrate. Additional terminals on the PoP substrate may then be coupled to terminals on the SoC integrated circuit, or other suitable location, using solder balls. Once the memories have been mounted, the method concludes in block 1107.

Although the operations are depicted as being performed in a sequential fashion, in other embodiments, one or more of the operations may be performed in parallel.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   a substrate including a first plurality of conductive paths, a first signal terminal on a first side of the substrate, and a second signal terminal on a second side of the substrate different than the first side, wherein the first plurality of conductive paths include a plurality of wires fabricated on a plurality of conductive layers, and wherein the first signal terminal is coupled to the second signal terminal via a particular conductive path of the first plurality of conductive paths;
   a first integrated circuit die coupled to the first side of the substrate using a first plurality of solder bumps, wherein the first integrated circuit die includes a plurality of circuit blocks, wherein a first circuit block of the plurality of circuit blocks includes a first power terminal coupled to the first signal terminal;
   a second integrated circuit die coupled, using a second plurality of solder bumps, to the second side of the substrate such that the substrate is between the first integrated circuit die and the second integrated circuit die, wherein the second integrated circuit die includes one or more voltage regulation circuits, wherein a given voltage regulation circuit of the one or more voltage regulation circuits includes an output power terminal coupled to the second signal terminal;
   a third integrated circuit die including a first plurality of passive circuit elements that includes at least one capacitor and at least one inductor, wherein the third integrated circuit die is directly connected to the first integrated circuit die using a first plurality of micro bumps such that the third integrated circuit die is between the first integrated circuit die and the substrate; and
   a fourth integrated circuit die including a second plurality of passive circuit elements that includes at least one capacitor and at least one inductor, wherein the fourth integrated circuit die is directly connected to the second integrated circuit die using a second plurality of micro bumps such that the fourth integrated circuit die is between the second integrated circuit die and the substrate.

2. The apparatus of claim 1, further comprising a power management unit that includes a plurality of Input/Output (I/O) terminals and is configured to generate a regulated power supply voltage.

3. The apparatus of claim 1, wherein the second integrated circuit die includes one or more inductors.

4. The apparatus of claim 3, wherein the second integrated circuit die includes a second plurality of conductive paths, and one or more capacitors, wherein a given one of the one or more capacitors is coupled to a second power terminal via a particular conductive path of the second plurality of conductive paths.

5. The apparatus of claim 1, wherein the first plurality of passive circuit elements includes one or more capacitors.

6. A system, comprising:
   a substrate including a first plurality of conductive paths, a first signal terminal on a first side of the substrate, and a second signal terminal on a second side of the substrate different than the first side, wherein the first plurality of conductive paths include a plurality of wires fabricated on a plurality of conductive layers, and wherein the first signal terminal is coupled to the second signal terminal via a particular conductive path of the first plurality of conductive paths;
   a first integrated circuit die coupled to the first side of the substrate using a first plurality of solder bumps and including a plurality of circuit blocks, wherein a first circuit block of the plurality of circuit blocks includes a first power terminal;
   a second integrated circuit die coupled, using a second plurality of solder bumps, to the second side of the substrate such that the substrate is between the first integrated circuit die and the second integrated circuit die, wherein the second integrated circuit die includes: one or more voltage regulation circuits;
      a second power terminal coupled to an output of a given voltage regulation circuit of the one or more voltage regulation circuits and the first power terminal of the first circuit block; and
      a third power terminal coupled to an input of the given voltage regulation circuit; and
   a third integrated circuit die coupled to the first power terminal of the first integrated circuit using a plurality of micro bumps as is positioned between the first integrated circuit die and the substrate, wherein the third integrated circuit die includes at least one capacitor and one inductor; and
   a power management unit coupled to substrate, wherein the power management unit is configured to generate a power supply voltage at a fourth power terminal, wherein the fourth power terminal is coupled to the third power terminal via a first conductive path of the first plurality of conductive paths.

7. The system of claim 6, further comprising a plurality of inductors and a plurality of capacitors, and wherein the power management unit includes a plurality of Input/Output (I/O) terminals.

8. The system of claim 7, wherein a given one of the plurality of inductors is coupled to a first I/O terminal of the plurality of I/O terminals via a second conductive path of the first plurality of conductive paths, and a given one of the plurality of capacitors is coupled to a second I/O terminal of the plurality of I/O terminals via a third conductive path of the first plurality of conductive paths.

9. The system of claim 7, wherein the second integrated circuit die includes one or more inductors.

10. The system of claim 9, wherein the second integrated circuit die includes at least at least one n-channel MOSFET coupled to a given inductor of the plurality of inductors.

11. The system of claim 6, further comprising one or more memory circuit dies.

12. The system of claim 11, wherein at least one of the one or more memory circuit dies is coupled to a package on package (PoP) substrate, and wherein the PoP substrate is coupled to the first integrated circuit die.

13. The apparatus of claim 1, wherein the first plurality of solder bumps are arranged surrounding a first region of the first integrated circuit die that includes the first plurality of micro bumps, and wherein the second plurality of solder bumps are arranged surrounding a second region of the second integrated circuit die that include the second plurality of micro bumps.

14. The system of claim 6, wherein the first plurality of solder bumps are arranged surrounding a region of the first integrated circuit die that includes the plurality of micro bumps.

* * * * *